United States Patent [19]

Kinoshita

[11] Patent Number: 4,884,280
[45] Date of Patent: Nov. 28, 1989

[54] SEMICONDUCTOR LASER DRIVING DEVICE FOR STABILIZING THE OPTICAL OUTPUT THEREOF

[75] Inventor: Osamu Kinoshita, Kawasaki, Japan

[73] Assignee: Kabushiki Kaisha Toshiba, Kawasaki, Japan

[21] Appl. No.: 248,112

[22] Filed: Sep. 23, 1988

[30] Foreign Application Priority Data

Sep. 25, 1987 [JP] Japan ................................ 62-241410

[51] Int. Cl.⁴ ............................................. H01S 3/00
[52] U.S. Cl. ........................................ 372/38; 372/29
[58] Field of Search ................................ 372/29, 38

[56] References Cited

U.S. PATENT DOCUMENTS

| | | | |
|---|---|---|---|
| 4,237,427 | 12/1980 | Holland | 372/29 |
| 4,612,671 | 9/1986 | Giles | 372/38 |
| 4,621,376 | 11/1986 | Nakamura et al. | |
| 4,713,819 | 12/1987 | Yoshikawa | 372/38 |
| 4,733,398 | 3/1988 | Shibagaki et al. | |
| 4,745,610 | 5/1988 | Yoshikawa | 373/38 |

FOREIGN PATENT DOCUMENTS

| | | |
|---|---|---|
| 0003273 | 8/1979 | European Pat. Off. |
| 59-145587 | 8/1984 | Japan |
| 2002950 | 2/1979 | United Kingdom |

OTHER PUBLICATIONS

Patent Abstracts of Japan, vol. 9, No. 270, (E-353), [1993], 26th Oct. 1985, & JP 60 115 278.

Primary Examiner—Lëon Scott, Jr.
Attorney, Agent, or Firm—Oblon, Spivak, McClelland, Maier & Neustadt

[57] ABSTRACT

In a laser driving device for stabilizing the optical output level of a semiconductor laser, a drive circuit supplies a drive current signal to the laser. A monitoring photodiode is provided for partially receiving the optical laser output to produce an electrical monitor signal indicative of the actual output level of the laser. A differential amplifier is connected to the photodiode to serve as a comparator for receiving a reference signal indicative of a reference output level of the laser, and for detecting a difference between values of the monitor signal and the reference signal to produce a comparison signal indicative of a change in the actual optical output level of the laser. An abnormal current eliminator is connected to the comparator, for, when the laser is disenergized or just after it is driven to become operative, controlling the comparator so that the comparison signal has a limited amplitude, whereby a current component undesirably supplied as the driven current to the laser is forcibly decreased to eliminate abnormal current from flowing in the laser.

10 Claims, 5 Drawing Sheets

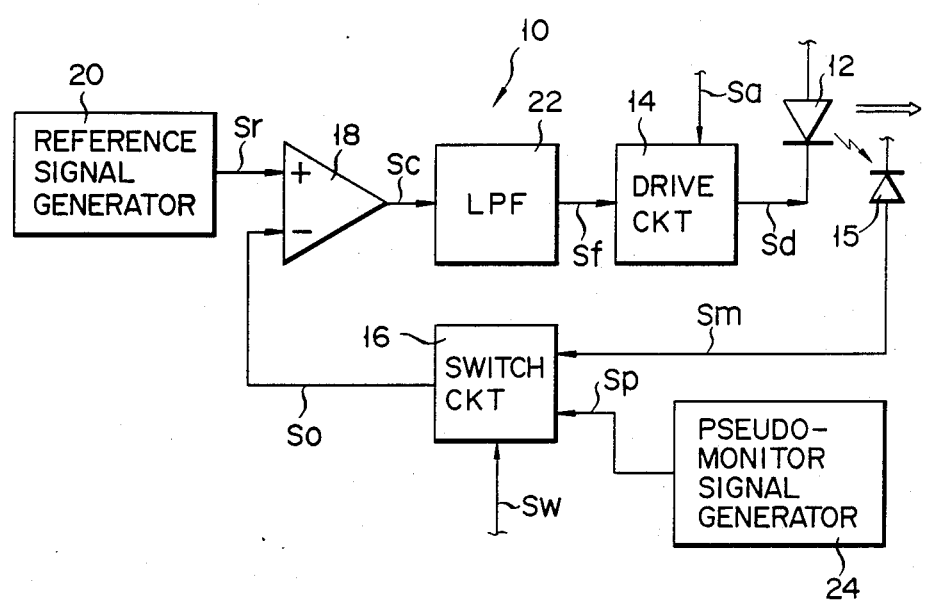
F I G. 2

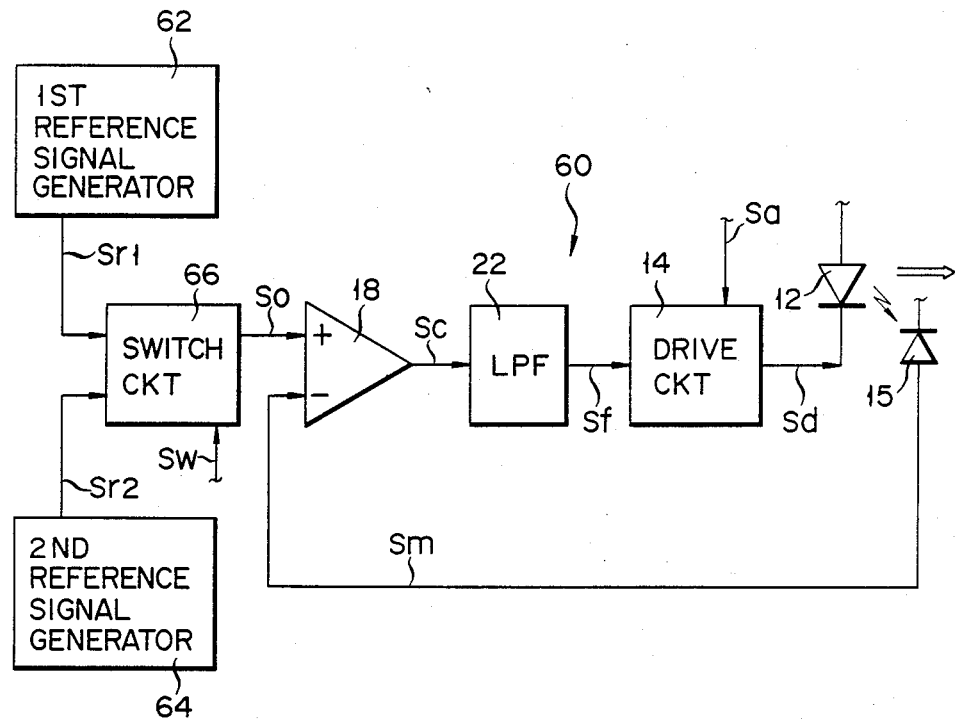
F I G. 6

SEMICONDUCTOR LASER DRIVING DEVICE FOR STABILIZING THE OPTICAL OUTPUT THEREOF

BACKGROUND OF THE INVENTION

1. Field of the Invention

The invention relates to the stabilization of the optical output characteristics of a semiconductor laser and, in particular, to a device for driving a semiconductor laser based on a feed-back controlling technique so as to eliminate the flow of over-current in the laser.

2. Description of the Related Art

Recently, semiconductor laser diodes have been proposed as an electro-optical converter for use in optical communication systems to convert digital or analog electrical signals into optical signals. A problem in such application is that the optical output characteristics of a semiconductor laser change with temperature.

To compensate for temperature changes in the laser output, it is required that a drive signal should be effectively controlled with respect to the amplitude of a bias current applied to the laser. In the conventional systems, however, when the laser diode is switched between a waiting mode and a normal oscillation mode, the above technical requirements cannot be satisfied sufficiently. This results in that rush current flow undesirably in the laser, when it is set in the waiting mode or when drive power is turned on to render the diode operative. In such a case, abnormal increase in the optical output level of the laser cannot be compensated effectively.

In Japanese Patent Disclosure (KOKAI) No. 59-145587, there is proposed to use a zener diode in a laser drive circuit, to thereby restrict the maximum level of the drive current to be supplied to the laser diode. With such an arrangement, however, since the maximum level of the optical laser output is simply limited to the fixed value, if such a value is too low, the operation range of the feed-back control loop for the laser output stabilization is narrowed, which leads to the degradation of the laser stabilizing performance.

SUMMARY OF THE INVENTION

It is therefore an object of the present invention to provide a new and improved device for effectively stabilizing the optical output level of a semiconductor laser.

It is another object of the present invention to provide a new and improved device for effectively stabilizing the optical output level of a semiconductor laser to eliminate the generation of over-current in the laser without degradation of the performance of normal laser stabilization.

In accordance with the above objects, the present invention is addressed to a specific device for stabilizing the optical output level of an electro-optical converter such as a semiconductor laser used in an optical data communication system. A driver unit is provided for supplying a drive current to the laser. A light sensitive unit is provided for producing an electrical monitor signal indicative of the actual optical output level of the laser. A comparator is connected to the light sensitive unit, for receiving an electrical reference signal indicative of a reference output level of the laser, and for detecting a difference between values of the monitor signal and the reference signal to produce an electrical comparison signal indicative of a change in the actual optical output level of the laser. A current eliminator is connected to the comparator, for, when the laser is disenergized for just after it is driven to become operative, controlling the comparator so that the comparison signal has a limited amplitude, whereby the drive current supplied to the laser is forcibly decreased to eliminate over-current from flowing in the laser.

The invention, and its objects and advantages, will become more apparent in the detailed description of preferred embodiments presented below.

BRIEF DESCRIPTION OF THE DRAWINGS

In the detailed description of a preferred embodiment of the invention presented below, reference is made to the accompanying drawings of which:

FIG. 2 is a block schematic diagram of a first embodiment of laser output stabilizing apparatus in accordance with the present invention;

FIG. 6 is a block schematic diagram of a second embodiment of laser output stabilizing apparatus in accordance with the present invention.

DETAILED DESCRIPTION OF THE PREFERRED EMBODIMENTS

In order to facilitate the understanding of the present invention, the conventional laser output stabilizing device having the typical arrangement will be described with reference to FIG. 1 prior to describing some embodiments of the present invention.

Figure 1:
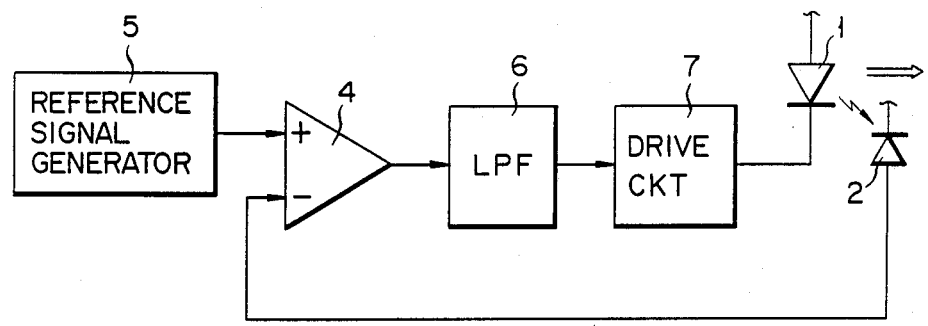
FIG. 1 a block schematic diagram of a conventional laser output stabilizing apparatus.

As shown in FIG. 1, the optical output of semiconductor laser 1 partially enters into photodiode 2, which monitors the real optical output of semiconductor laser 1 to output a monitoring signal. This monitoring signal is supplied to comparator 4, which serves to receive a reference signal generated by reference signal generator circuit 5, compare the monitoring signal with the reference signal,a nd generate a comparison-resultant signal indicative of the difference between these two monitoring and reference signals. The comparison-resultant signal is passed through low-pass filter 6, whose output signal is supplied to laser driver circuit 7. With this feedback control circuit loop arrangement, the optical output of semiconductor laser 1 can be stabilized to be substantially constant regardless of any change in ambient temperature and/or power source.

According to the above-described conventional arrangement for stabilizing the optical output of the semiconductor laser, however, no effective stabilizing control can be expected in the case where semiconductor laser 1 is driven to switch from waiting mode to normal oscillation mode and vice versa. More specifically, comparator 4 tends to abnormally raise the level of its output signal when semiconductor laser 1 is under waiting mode or driver circuit 7 is switched on to drive semiconductor laser 1. This is due to the fact that the output signal of monitoring photodiode 2 is zero in its level under the above state. Driver circuit 7 supplies semiconductor laser 1 with drive current, which has been raised in response to the comparison-resultant signal whose signal level is abnormally high. As the result, rush current, or over current, flows in laser 1. The generation of rush current causes the physical properties of semiconductor laser 1 to be deteriorated or elements to be broken.

The above-mentioned conventional problem can be effectively solved by some embodiments of the present invention which will be described below.

A preferred embodiment of the device for stabilizing the output signal level of the semiconductor laser according to the present invention is generally denoted by reference numeral 10 in FIG. 2. Semiconductor laser diode 12 is supplied with bias current or drive current by driver circuit 14, which operates responsive to mode-instructing signal Sa. Semiconductor laser diode 12 is thus oscillated to emit optical signals. Monitoring photodiode 15 is provided to partially receive optical output of laser diode 12. Photodiode 15 produces electrical monitor signal Sm indicative of the actual intensity of light incident upon it. Monitor signal Sm is transmitted to comparator 18 through switch circuit 16. Comparator 18 is a differential operational amplifier.

Comparator 18 receives monitor signal Sm a its inverting input. Comparator 18 also receives at its non-inverting input reference signal Sr which is generated by reference signal generator circuit 20 so as to indicate the reference value of laser optical outputs. Comparator 18 compares these input signals to produce comparison-resultant signal Sc indicative of the difference between these input signal. Comparison resultant signal Sc is supplied to driver circuit 14 through well-known low-pass filter circuit 22, which serves to remove high frequency components from signal Sc (the feedback of these components causes the laser stabilizing control operation to be made unstable). Driver circuit 14 controls drive current signal Sd, which is supplied to laser diode 12 responsive to output signal Sf of filter 22, so as to compensate any change in the optical output of the laser. With the use of the feed-back control loop, the optical output of laser diode 12 can thus be stabilized.

Switch circuit 16 receives monitor signal Sm at the first input thereof. Switch circuit 16 is connected at the second input thereof to pseudo-monitor signal generating circuit 24, which generates pseudo-monitor signal Sp having its signal level higher than that of reference signal Sr. Switch circuit 16 acts to perform the switching operation in response to switching control signal Sw and to selectively supply comparator 18 with either one of signals Sm and Sp transmitted thereto. The output signal of switch circuit 16 is designated by "So" in FIG. 2.

The operation mode of the present embodiment with such a circuit arrangement will now be described with reference to FIG. 3. When mode-instructing signal Sa has the "L" level, laser diode 12 of this device is set to the waiting mode. In the waiting mode, switch circuit 16 is switched, in response to control signal Sw, to provide a switch condition wherein pseudo-monitor signal Sp supplied to the second input thereof is transmitted to comparator 18. When mode-instructing signal Sa has the "H" level, this device is set to the normal oscillation mode, in which laser diode 12 is rendered operative. Under such a condition, switch circuit 16 is switched in response to control signal Sw to provide a different switch condition wherein monitor signal Sm supplied to the second input of switch circuit 16 is transmitted to comparator 18.

In the waiting mode, the output signal of monitoring photodiode 15, i.e., monitor signal Sm, is prevented from being supplied to comparator 18. Alternatively, pseudo-monitor signal Sp is supplied to comparator 18 through switch circuit 16. As shown in FIG. 3, pseudo-monitor signal Sp is generated by circuit 24 so as to have a specific signal level Vp which is higher than reference level Vr of reference signal Sr. At this time, comparator 18 which receives pseudo-monitor signal Sp at the inverting input thereof generates comparison-resultant signal Sc. (The waveform of comparison-resultant signal Sc obtained after the low-pass treatment is shown by "Sf" in FIG. 3). In other words, pseudo-monitor signal Sp which is supplied to the inverting input of comparator 18 is raised in its voltage level in such a way that output signal Sc of comparator 18 is forcedly reduced in its signal level to eliminate any kind of abnormal current component which is erroneously supplied from drive circuit 14 to laser diode 12 and which undesirably acts as the drive current signal Sd. The voltage level of pseudo-monitor signal Sp particularly in this embodiment is raised high enough to make substantially zero the drive current signal Sd which is supplied from driver circuit 14 to laser diode 12. As the result, the optical output level of laser diode 12 which is under waiting mode is fixed substantially zero, as shown by "O" in FIG. 3. It is thus possible to prevent rush current from flowing in laser diode 12 in the waiting mode. Further, no Zener diode which serves only to limit the drive current applied to laser diode 12 is used, the operation range of the feedback control loop for stabilizing the optical output level of the laser is not narrowed to the undesirable extent.

Figure 3:
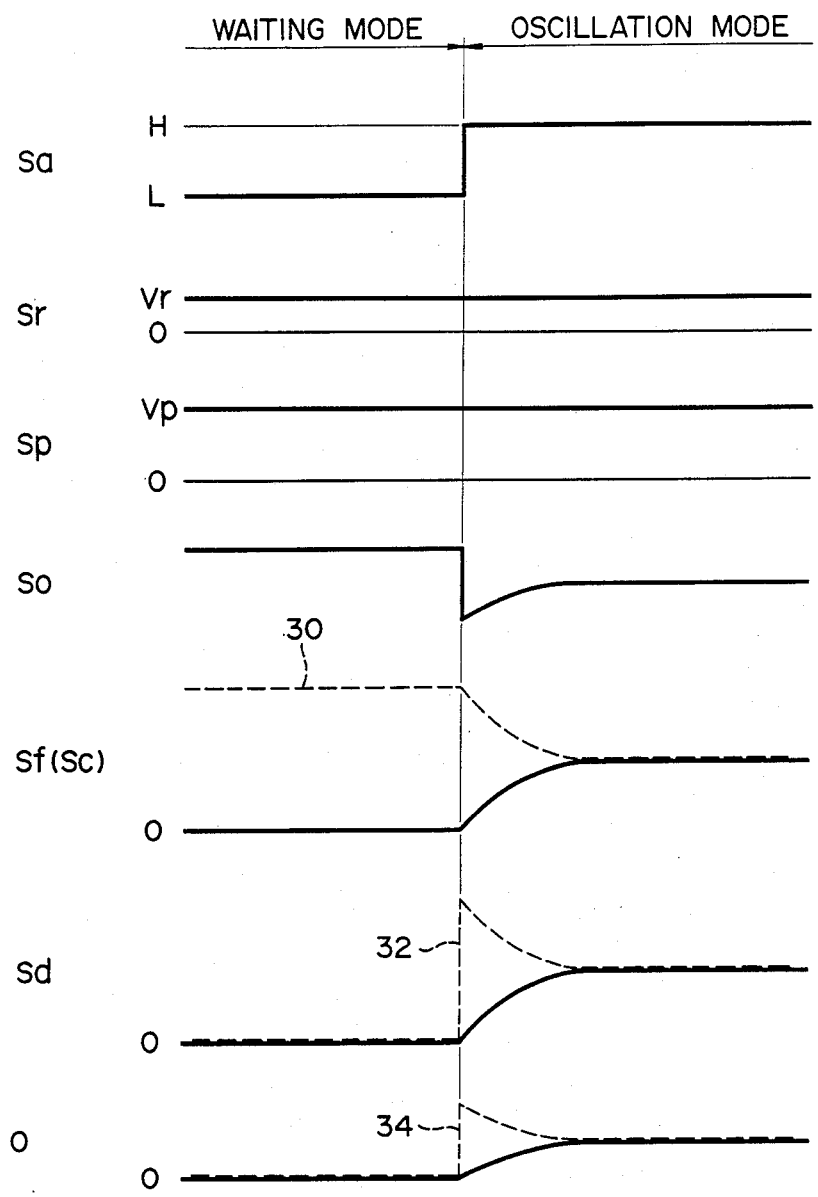
FIG. 3 is a diagram showing the waveforms of signals generated at the main parts of the laser output stabilizing apparatus of FIG. 2.

Broken lines 30, 32 and 34 in FIG. 3 represent level changes in the comparison-resultant signal, drive signal and optical laser output in the case of the conventional device which was described above with reference to FIG. 1. It is clear form just viewing FIG. 3 that when the conventional device is under waiting mode, comparison-resultant signal (Sc or Sf) is raised as shown by broken line 30 and that, when the power source is switched on to change the mode, output signal (Sd) of driver circuit 7 is thus sharply raised as shown by broken line 32. This means that rush current is generated in laser diode 12. The optical output level of laser diode 12 is thus undesirably and excessively raised as shown by broken line 34 and drive current is raised high to overcome the current which is allowable for laser diode 12, thereby damaging the elements in the worst case. This danger can be certainly eliminated, as described above, according to the present invention.

According to the above-described embodiment of the present invention, it is prevented that pseudo-monitor signal Sp is supplied to comparator 18 under normal oscillation mode. Alternatively, output signal or monitor signal Sm is supplied from monitoring photodiode 15 to comparator 18 through switch circuit 16. Output signal Sc of comparator 18 (or output signal Sf of filter 22) is forcedly controlled, just till then, to have a low level. Even when the device is switched from waiting mode to normal oscillation mode, therefore, drive signal Sd rises gradually from zero level not to sharply raise the optical output level of laser diode 12.

Figure 4:
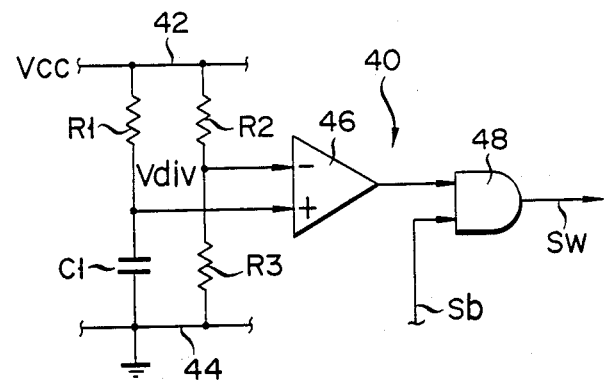
FIG. 4 is a diagram showing a circuit configuration of a switching controller circuit used in the laser output stabilizing apparatus of FIG. 2.

A typical circuit arrangement of switching control circuit 40 which is preferably employed for the above-described embodiment of the present invention is shown in FIG. 4. According to this circuit 40, a first series circuit of resistor R1 and capacitor C1 and a second series circuit of resistors R2 and R3 are connected parallel to each other between power source line 42 and earthed line 44. Comparator 46 which is a differential amplifier has a non-inverting input connected to the node between resistor R1 and capacitor C1 and an inverting input connected to the node between resistors R2 and R3. AND gate 48 has a first input connected to the output of comparator 46 and a second input to which mode indicating signal Sb is supplied.

Figure 5:
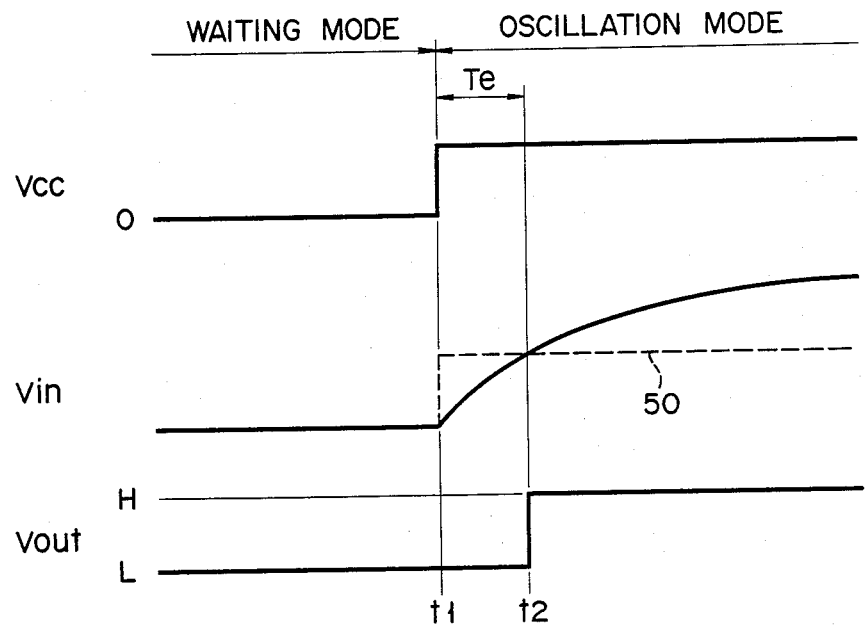
FIG. 5 is a diagram showing the waveforms of signals generated at the main parts of the switching controller circuit of FIG. 4.

When driver circuit 14 is connected to power source Vcc at time t1, potential on line 42 rises sharply (or like a step) as shown in FIG. 5. Capacitor C1 is charged responsive to this potential change, so that potential Vin at the non-inverting input of comparator 46 thus rises gradually. Dividing voltage Vdiv of resistors R2 and R3, which has a constant potential as shown by broken line 50 in FIG. 5, is being applied to the inverting input of comparator 46 this time period. Comparator 46 compares these voltages to generate comparison-resultant signal Vout of level "H" when the gradually-increasing input voltage becomes equal to dividing voltage Vdiv at time t2. Under such a condition, if mode indicating signal Sb has level "H" to indicate normal oscillation mode, AND gate 48 will output switch control signal Sw of level "H".

More specifically, control signal Sw to be supplied to switch circuit 16 (see FIG. 2) continues to have level "L" during time period Te (or interval between times t1 and t2) the length of which is determined by time constants of resistor R1 and capacitor C1. Therefore, switch circuit 16 continues to supply pseudo-monitor signal Sp to comparator 18 during time period Te just after the mode change. Output signal Sc of comparator 18 (and filter output signal Sf) are thus forcedly set low or preferably zero in level during this time period Te and this assures that over-current can be prevented from generating in laser diode 12 at the time of mode change. It should be noted that, when the time constant R1·C1 is selected to be larger than that of low-pass filter 22, drive current signal Sd applied to laser diode 12 can be controlled to excellently rise as shown by a solid line in FIG. 3, since laser diode 12 is temporarily kept waiting and then brought into the oscillation state. This elimination of rush current achieved by the present invention is not influenced by the inequality in the element properties of laser diode 12 itself, so that the reliability of stabilizing the optical output level of the laser at the time when the mode of laser diode 12 is changed is quite high.

A second embodiment of the laser optical output stabilizing device according to the present invention is generally denoted by reference numeral 60 in FIG. 6. Same components as those in the first embodiment of FIG. 2 will be represented by same reference numerals, and description on these components will be omitted in the following explanation.

In this device 60, output signal Sm of monitoring photodiode 15 is supplied directly to the inverting input of comparator 18. Two reference signal generator circuits 62 and 64 are provided to generate reference voltage signals Vr1 and Vr2 which are different from each other. Switch circuit 66 receives these signals Vr1 and Vr2 and selects one of them. The output of switch circuit 66 is connected to the non-inverting input of comparator 18.

Figure 7:
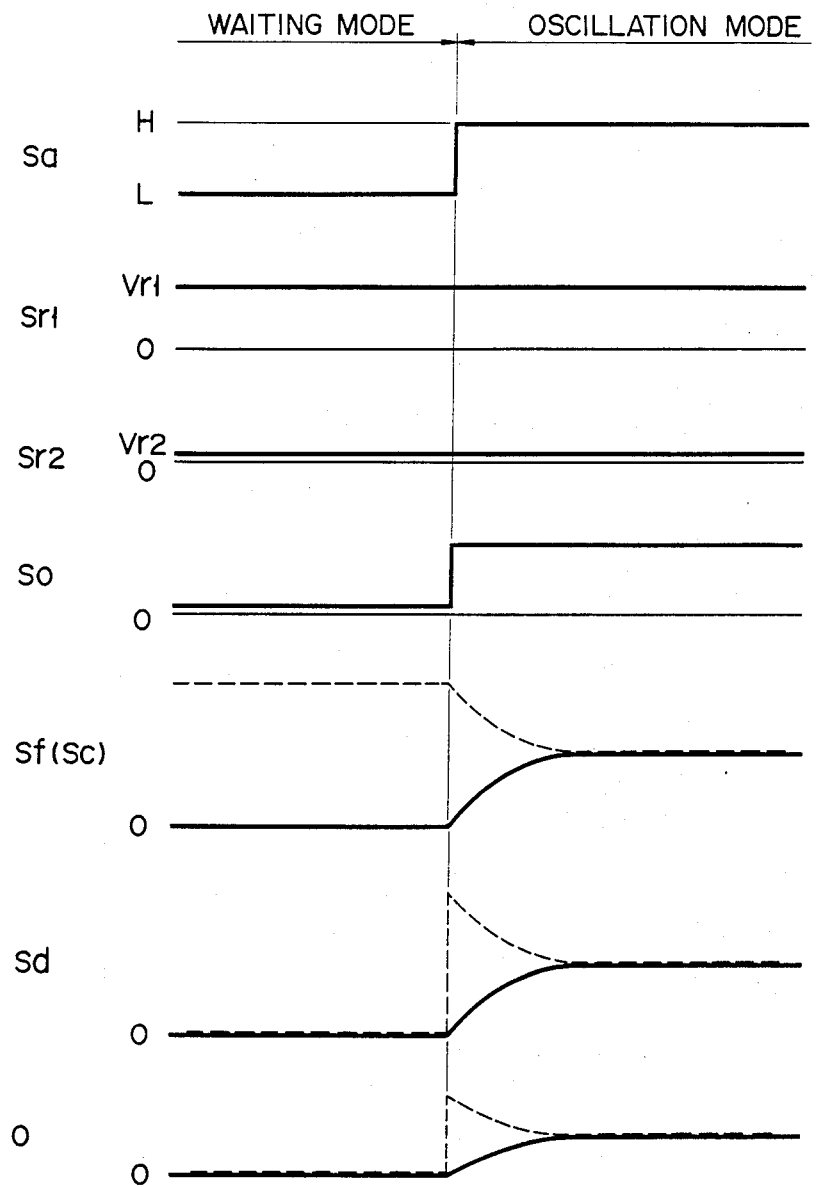
FIG. 7 is a diagram showing the waveforms of signals generated in the main parts of the laser output stabilizing apparatus of FIG. 6.

Reference signal generator 62 serves as a main generator which corresponds to the one 20 in the above-described first embodiment. Output signal Sr1 of this main reference signal generator 62 represents a normal reference value relating to the optical output level of laser diode 12. Another reference signal generator 64 serves as a sub-generator for generating sub-reference signal Sr2 which has a voltage level lower than that of main reference signal Sr1. Typically, sub-reference signal Sr2 is selected to have a value smaller than that one which corresponds to either the optical output naturally emitted from laser diode 12 or the over-current of photodiode 15. According to this second embodiment, sub-reference signal Sr2 is selected to have a value substantially equal to or smaller than zero level as shown in FIG. 7.

Switch circuit 66 carries out its switching operation responsive to switching control signal Sw in such a way that main reference signal Sr1 generated by main generator 62 is supplied to comparator 18 when laser diode 12 is under normal oscillation mode and that sub-reference signal Sr2 generated by subgenerator 64 is alternatively supplied to comparator 18 when laser diode 12 is under waiting mode. Subreference signal Sr2 having the limited voltage level is supplied to the non-inverting input of comparator 18, when laser diode 12 is under waiting mode and during certain time period Te (see FIG. 5) just after the waiting mode is changed to the oscillation mode. Output signal So of comparator 18 is therefore forcedly set low or preferably zero in level this time. Even when monitor signal Sm applied from photodiode 15 which is monitoring laser diode 12 is low in level (so small in value as to correspond to the natural optical output of laser diode 12, or so small in value as to correspond to a level caused by the inequality in the element properties of laser diode of laser diode 12), since reference signal Sr2 itself which is to be compared with signal Sm is as small in value as signal Sm, comparison-resultant signal Sc (and filter-processed comparison-resultant signal Sf) can be prevented from decreasing the drive current applied to laser diode 12. This contributes to reliably preventing the generation of excessive current in laser diode 12.

According to this second embodiment of the present invention, none of the above-described circuit components for restraining the generation of excessive current is added to the feedback control loop which comprises laser drive circuit 14, monitoring photodiode 15, comparator 18 and low-pass filter 16 to stabilize the optical output level of laser diode 12. Therefore, the speed of stabilizing the optical output level of the laser cannot be made low, as seen when some additional circuit components are added to the feedback control loop. This is particularly advantageous when this second embodiment of the present invention is applied to high-speed optical data communication systems.

Although the present invention has been described with reference to some embodiments, it should be understood by those skilled in the art that various modifications can be made without departing from the spirit and scope of the present invention.

For example, it may be arranged in the device shown in FIG. 2 that the monitor and pseudo-monitor signals of the semiconductor laser are not made independent of the other and that when the laser diode is under waiting mode, direct-current signal or the like is added to the monitor signal to generate the pseudo-monitor signal. It may also be arranged in the device shown in FIG. 6 that the first and second reference values are not made signals independent of the other and that when the laser diode is under waiting mode, direct-current signal or the like obtained from the negative power source is added to one of the reference values to generate the other reference value. Further, the first and second reference values may not be direct-current signals but they may be pulse signals or smoothed pulse signals. Furthermore, LPF may be arranged at a stage prior to the comparator or LPF may be omitted by using the comparator which operates at a low speed. Still furthermore, the photo-transistor, PIN photodiode or the like may be used as the optical sensor for monitoring the laser light. As apparent from the above, various changes and modifications can be made without departing from the gist of the present invention.

What is claimed is:

1. A device for stabilizing an optical output level of a semiconductor laser, said device comprising:

driver means for supplying a drive current to the laser;

light sensitive means for producing an electrical monitor signal indicative of the actual optical output level of said laser;

comparator means, connected to said light sensitive means, for receiving and electrical reference signal indicative of a reference output level of said laser, and for detecting a difference between values of the monitor signal and the reference signal to produce an electrical comparison signal indicative of a change in the actual optical output level of said laser; and compensator means connected to said comparator means, for, when said laser is switched from a waiting mode to a normal oscillation mode for sending data, supplying said comparator means with an electrical compensation signal which serves to cause said comparator means to generate a certain comparison output having an amplitude low enough to set a current component supplied as the drive current to said laser to be forcibly decreased so that an abnormal current is eliminated from flowing in said laser.

2. The device according to claim 1, wherein said compensator means comprises:

signal generating means for generating an electrical pseudo-monitor signal having an amplitude which is larger than that of the monitor signal actually generated by said light sensitive means; and switching means, connected to said light sensitive means and said signal generating means, for feeding said comparator means with said pseudo-monitor signal when the operation of said laser is changed from the waiting mode to the normal oscillation mode.

3. The device according to claim 2, wherein said comparator means comprises:

a differential amplifier having an inverting input and a non-inverting input, said switching means having an output connected to the inverting input of said amplifier.

4. The device according to claim 1, wherein said compensator means comprises:

first signal generator means for generating a sub-reference signal;

second signal generator means for generating a sub-reference signal having an amplitude which is smaller than that of said reference signal; and switching means, connected to said light sensitive means and said first and second signal generator means, for feeding said comparator means with said sub-reference signal when the operation mode of said laser is changed from the waiting mode to the normal oscillation mode.

5. The device according to claim 4, wherein said comparator means comprises:

a differential amplifier having an inverting input and a non-inverting input, said switching means having an output connected to the non-inverting input of said amplifier.

6. An optical device comprising:

a semiconductor laser;

driver means for receiving an operation mode assignment signal which designates a mode of said laser, and for feeding drive power to said laser in response to said signal;

monitor means for producing an electrical monitor signal indicative of an actual optical output of said laser;

signal generator means for generating an electrical reference signal indicative of a reference output level of said laser;

comparator means, connected to said monitor means and said signal generator means, for detecting a difference between values of the monitor signal and the reference signal to produce an electrical error signal indicative of a change in the actual optical output level of said laser; and current eliminator means connected to said comparator means, for controlling, when said laser becomes operative, said comparator means so as to generate a specific output signal having a constant amplitude in a time interval of a predetermined length after said laser become operative, said constant amplitude being sufficiently small to cause a bias current supplied to said laser to be forcibly decreased so that over-current is eliminated from flowing in said laser.

7. The optical device according to claim 4, wherein said current eliminator means comprises:

second signal generator means for generating a pseudo-monitor signal having a signal amplitude larger than a normal amplitude of said monitor signal;

switch circuit means connected to said monitor means, said second signal generator means and said comparator means, for selectively generating at an output thereof one of the monitor signal and the pseudo-monitor signal; and time controller means connected to said switch circuit means, for receiving the operation mode assignment signal in response to which said laser becomes operative, for detecting that a predetermined time period has passed after the reception of said mode assignment signal, and for generating a switching control signal for said predetermined time period, said switching control signal being supplied to said switch circuit means, which then supplies said pseudo-monitor signal to said comparator means in said time period.

8. The optical device according o claim 7, wherein said comparator means comprises a differential amplifier having a non-inverting input to which the first signal generator means is connected and an inverting input to which the output of said switch circuit means is connected.

9. The optical device according to claim 4, wherein said current eliminator means comprises:
- second signal generator means for generating a second reference signal having a signal amplitude smaller than that of the first reference signal generated by the first signal generator means;
- switch circuit means connected to said first signal generator means, said second signal generator means and said comparator means, for selectively generating at an output thereof one of the first and second reference signals; and
- time controller means connected to said switch circuit means, for receiving the operation mode assignment signal in response to which said laser becomes operative, for detecting that a predetermined time period has passed after the receival of said mode assignment signal, and for generating a switching control signal for said predetermined time period, said switching control signal being supplied to said switch circuit means, which then supplies said second reference signal to said comparator means in said time period.

10. The optical device according to claim 9, wherein said comparator means comprises a differential amplifier having an inverting input to which said monitor means is connected, and and a non-inverting input to which the output of said switch circuit means is connected.

* * * * *